United States Patent [19]

Lee et al.

[11] Patent Number: 5,023,875
[45] Date of Patent: Jun. 11, 1991

[54] INTERLACED SCAN FAULT DETECTION SYSTEM

[75] Inventors: Gene W. Lee, Huntington Beach; George D. Underwood, Inglewood, both of Calif.

[73] Assignee: Hughes Aircraft Company, Los Angeles, Calif.

[21] Appl. No.: 357,234

[22] Filed: May 26, 1989

[51] Int. Cl.$^5$ ............................................ G06F 11/00
[52] U.S. Cl. ................................. 371/25.1; 371/151; 371/22.1; 371/22.3
[58] Field of Search .................... 371/15.1, 25.1, 22.1, 371/22.3; 364/578, 488; 324/73.1

[56] References Cited

U.S. PATENT DOCUMENTS

| | | | |
|---|---|---|---|
| T924,006 | 7/1974 | Chia et al. | 371/22.1 |
| 3,761,695 | 9/1973 | Eichelberger | 371/22.3 |
| 4,063,080 | 12/1977 | Eichelberger et al. | 371/62 |
| 4,146,835 | 3/1979 | Chnapko et al. | 371/22.1 |
| 4,293,919 | 10/1981 | Dasgupta et al. | 364/716 |
| 4,308,616 | 12/1981 | Timoc | 371/23 |
| 4,366,393 | 12/1982 | Kasuya | 371/22.3 |
| 4,534,028 | 8/1985 | Trischler | 371/22.3 |
| 4,701,917 | 10/1987 | Jones et al. | 371/15.1 |
| 4,852,093 | 7/1989 | Koeppe | 364/578 |

Primary Examiner—Jerry Smith
Assistant Examiner—Phung My Chung
Attorney, Agent, or Firm—William J. Streeter; Wanda K. Denson-Low

[57] ABSTRACT

A fault detection system 50 includes first and second serial data shift register stages 74, 94 which are connected to a logic circuit under test 106, and a third serial data shift register stage 84 which is logically connected between the first and second serial data sift register stages 74, 94. The fault detection system 50 permits all paths of the logic circuit under test 106 to be sensitized and allows for the detection of all propagation delay type faults at substantially the operational speed of the logic circuit under test 106.

10 Claims, 3 Drawing Sheets

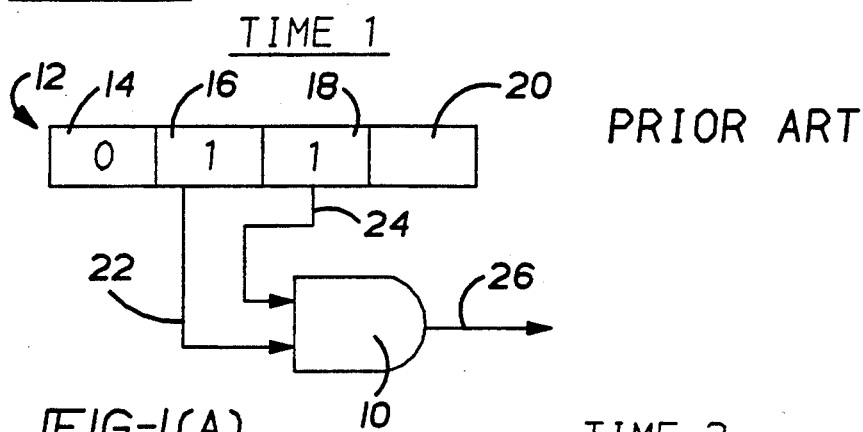
FIG-1(A) PRIOR ART
FIG-1(B) PRIOR ART
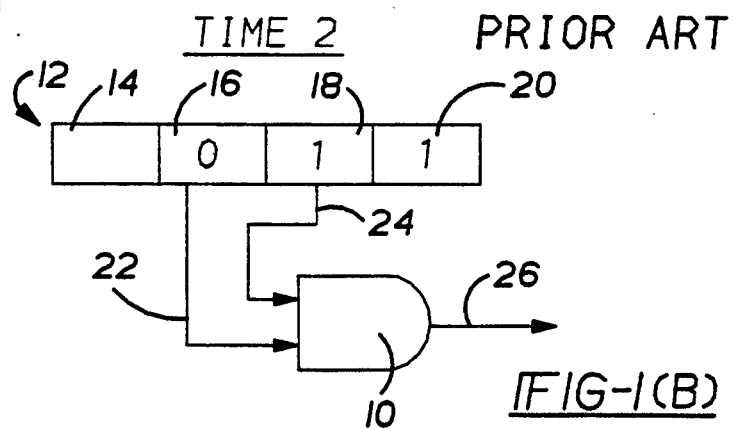
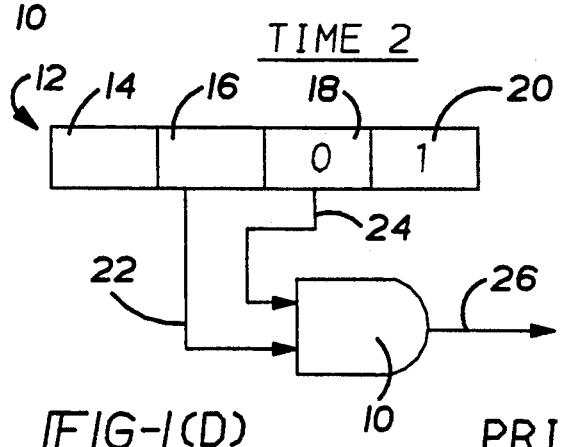
FIG-1(C) PRIOR ART
FIG-1(D) PRIOR ART

INTERLACED SCAN FAULT DETECTION SYSTEM

BACKGROUND OF THE INVENTION

1. Field of the Invention

This invention relates to a system for detecting faults associated with a logic circuit and more particularly to a system in which serial data shift registers are interfaced to the logic circuit such that substantially all of the propagations delay errors associated with the circuit are detected at the approximate operational speed of the circuit.

2. Discussion

In general, propagation delay faults associated with a logic circuit usually result in the production of an error in the logic circuit's output signal. This output error is usually due to delays in the propagation of signals through the constituent elements and signal paths of the logic circuit. Propagation-delay-type faults may drastically reduce the operational capability of a logic circuit. Additionally, propagation delay faults are usually particularly difficult to isolate during the actual operation of the logic circuit. This difficulty in detection is due to the fact that in actual logic circuit operation the fault detector is left to probe manually in an environment in which the failure condition may be difficult to replicate, such as with faults which are associated with temperature or low supply voltage.

To effectively test for propagation delay faults, it is necessary to test several of the most critical signal paths within the logic circuit. This testing should be done at the approximate operational speed of the logic circuit. Testing at lower speeds might result in the "masking" of some propagation delay faults. That is, excessive propagation delay might not become evident at speeds which are slower than that of the logic circuit's normal operation.

SUMMARY OF THE INVENTION

According to the teachings of the present invention, substantially all of the propagation delay faults associated with a logic circuit may be detected at the approximate operational speed of the logic circuit. This may be accomplished by the sensitization of substantially all of the paths of the logic circuit. This sensitization may be accomplished by connecting a plurality of first and second serial data shift registers to the logic circuit. A third plurality of shift registers is connected logically between the first and second serial data shift registers. Test data may be input to either the first or second serial shift registers such that all the paths of the logic circuit are sensitized. This path sensitization allows substantially all of the propagation delay faults, of the logic circuit, to be detected at the approximate operation speed of the circuit.

BRIEF DESCRIPTION OF THE DRAWINGS

In describing the overall invention, reference will be made to the accompanying drawings wherein:

FIG. 1(A–D) are graphical illustrations of prior art techniques showing the general interconnection of serial data shift registers to a logic circuit;

DESCRIPTION OF THE PREFERRED EMBODIMENT

Figure 2A:
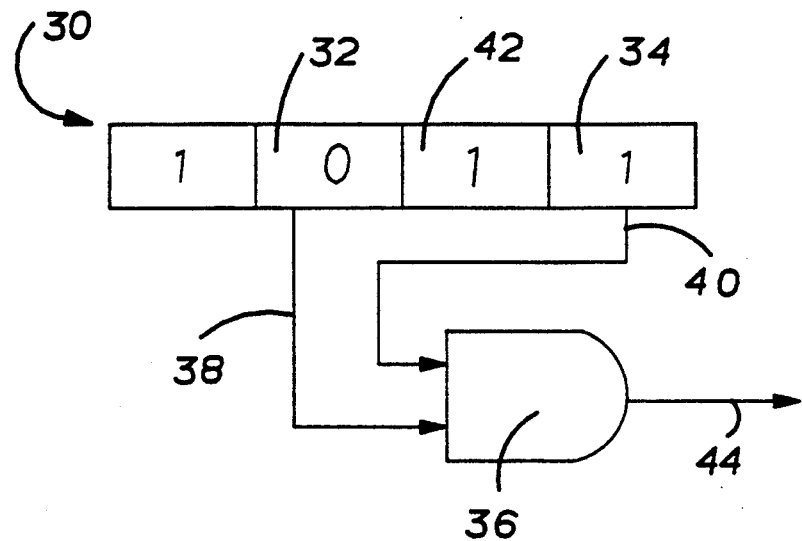
FIG. 2(A–B) are graphical illustrations of the techniques associated with this invention which allow for substantially all of the propagation delay faults associated with a logic circuit to be tested at the approximate operating speed of the logic circuit.

In order to fully comprehend the operation of the preferred embodiment of this invention it is first helpful to discuss path sensitization concepts and general serial register interconnection schemes. Generally, a logic circuit may contain a plurality of logic elements (e.g. AND gates) which are interconnected by a plurality of signal paths. The logic circuit may also contain one or more input and output signal paths. Path sensitization represents a well known technique whereby a path is defined to be the interconnection of a single circuit input and output path through the individual logic elements of the logic circuit. For a path through an individual logic element (e.g. a three input "AND" gate or a two input "OR" gate) to be "sensitized", all other inputs to said logic element must be in the appropriate logic state such that the inputs to the path will directly alter the output of the path. For example, to sensitize a path through an "OR" gate-type of logic element, inputs to the "OR" gate not associated with the chosen path must be in a logical zero state thereby making the output of the logic element directly dependent on the logic state of the input path (e.g. the output state of the "OR" gate will take on the value of the input path logic state after the appropriate propagation delay associated with the "OR" gate). A plurality of such paths may exist for any logic circuit. During propagation delay fault testing, test data is input to the logic circuit such that all of the aforementioned paths are sequentially sensitized and used to transfer alternately high and low signals. Such a transfer along a sensitized path may be referred to as "exercising" the path. The exercise of a single path represents a single test. Each test has a specific output value associated with it which is known beforehand by analyzing the known test data relative to the logic elements within the sensitized path. By comparing the actual output signal associated with the test with the computed value, one can determine if a fault associated with a sensitized path exists. Specifically, if one monitors this output value at the operational speed of the logic circuit under test, one may detect propagation delay faults associated with the paths that are sensitized. If one sequentially sensitizes all such paths, a complete detection of propagation delay faults associated with a given logic circuit may be obtained. A complete description of the technique of path sensitization is given on pages 234–236 of *SWITCHING AND FINITE AUTOMATA THEORY*, 2nd. Ed. by KOHAVI. It should be realized that the selection of test data is important to the path sensitization process because the test data that is used determines what path is sensitized at any given period of time.

FIG. 1 illustrates the generally accepted method of interfacing serial data shift registers to a logic circuit for the general purpose of storing and transferring data to the logic circuit. This general interconnection scheme is discussed here only to show its inadequacy in fault testing applications requiring path sensitization. The logic circuit to be tested, in FIG. 1, is an AND gate 10. AND gate 10 is connected to individual register stages or bits 16 and 18 of register 12. The register stages (14–20) of FIG. 1(A–D) are of the serial data shift type.

Signal line 22 connects one input of AND gate 10 to register stage 16. Signal line 24 connects the other input of AND gate 10 to register stage 18.

The initial test, denoted as test 1, seeks to sensitize the circuit path (which in this case is also the AND gate logic element path) beginning at the input signal line 22 and propagating through the logic element of AND gate 10 to the output signal line 26. By forcing the input signal on line 22 to undergo a logical high to low (i.e. a one to zero) transition while maintaining the signal on line 24 in the logically high state, propagation delay errors associated with the sensitized path, are detected. At initial time, denoted as Time 1, in FIG. 1(A) register stages 16 and 18 both contain logical values equal to one. Due to the aforementioned interconnection scheme the values in register stages 16 and 18 are coupled to signal lines 22 and 24 respectively. Signal lines 22 and 24 are input to AND gate 10. Since logical circuit 10 is an AND gate, the output signal 26 is a logical one. To path sensitize signal path 22 in the aforementioned manner, it is necessary at Time 2 (FIG. 1(B)) to maintain signal path 24 in the state equal to a logical one. Signal line 22 is forced to a logic state of zero at Time 2 in order to exercise the sensitized path. This is done by shifting into register stage 18 the previous value of register stage 16, thus forcing signal path 24 to remain at the state of logical one. Register stage 16 must as a result of the same shift function be made to contain a logical zero. This is done by initially (i.e. at Time 1) placing a logical zero value into register stage 14 and subsequently shifting the value (at Time 2) into register stage 16. This shifting of data is standard for such registers. At Time 2 therefore, signal path 22 has successfully been path sensitized for a one to zero transition.

This standard interconnection scheme does not provide for path sensitization of all paths. This deficiency is illustrated in test 2 of FIG. 1(C-D). At Time 1 register stages 16 and 18 contain logical zero and one values, respectively, in order to force signal paths 22 and 24 to similar states. Output signal line 26 is a logical zero. If one now desired to sensitize signal path 22 and exercise it with a logical zero to one transition, at Time 2, it becomes necessary, by definition, to maintain signal line 24 at a constant logical one state. As shown in FIG. 1(D), this becomes impossible at Time 2 since register stage 18 must now contain the contents that register stage 16 previously had at Time 1. These aforementioned contents must be equal to a logical zero because signal path 22 was initially logically zero. Thusly, the aforementioned general serial shift data register interfacing scheme does not provide for path sensitization testing as proposed above.

Reference to FIG. 2(A-B) will help understand the general concept of the present invention. Register 30 is shown as containing register stages 32 and 34 which are connected to logic circuit 36 through respective signal lines 38 and 40. However, if at least one register bit, such as register stage 42, is logically placed between the logic circuit 36 interfacing register stages (i.e. 32 and 34) substantially all paths associated with the logic circuit 36 may be sensitized. This increased path sensitization capability is due to the fact that one may prudently select values for these "interlaced register stages" such as 42 so that the register stage into which their contents is shifted to, will contain an appropriate value to effect the desired sensitization. Since these interlaced register stages 42 are not connected to the logic circuit 36, their contents may be defined in a manner which is independent of any instant impact upon the logic circuit 36.

Figure 2B:
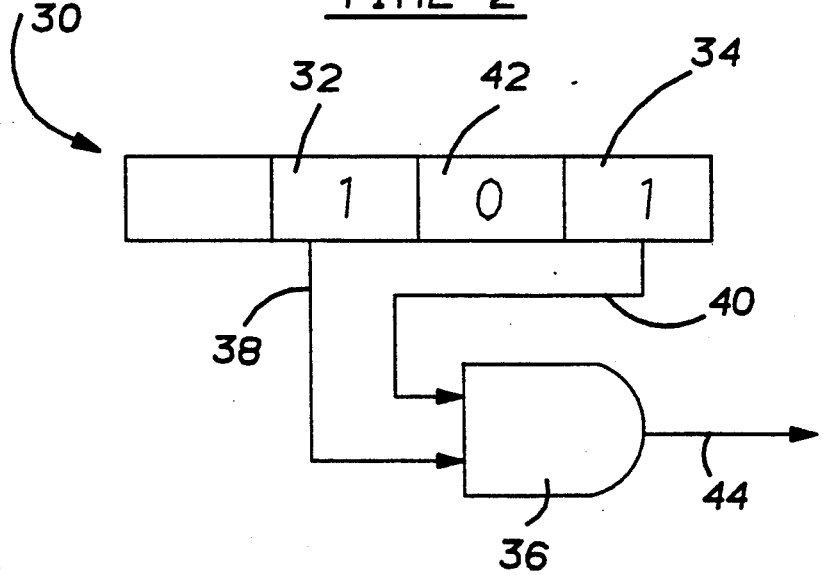

As an example of the use of this invention let us consider the previous example in which the standard serial data shift register interconnection scheme failed to produce a desire path sensitization. As shown in FIG. 2(A), at Time 1 signal lines 38 and 40 are placed in a logical zero and one state respectively. This initial state is due to their connection to register stages 32 and 34 respectively. Logic circuit 36 is an AND gate and has an output signal line 44 which at Time 1 is at a logical zero state. If it is now desired to sensitize signal path 38, and force it to undergo a logical zero to one transition at Time 2 (shown in FIG. 2(b)), it would, by definition, be necessary to maintain signal line 40 in a constant logical one state.

Previously, it was found that it would be impossible to achieve this state of signal line 40 using the conventional interconnection scheme. It now becomes possible with the interlaced scan interconnection scheme however because of the placement of register stage 42 logically between register bits 32 and 34. In this context, the term "logically" between 32 and 34 refers to the fact that the contents of register 32 must first be stored and transferred through register 42 before they arrive at register 34. Similarly, the aforementioned terms "logical one" and "logical zero" are terms of art which refer to mechanical, electrical, hydraulic, optical, or other substantially similar reference levels used by a specific implementation of logic. For example, the widely known transistor - transistor logic (TTL), of Texas Instrument's type 54 gates having an ambient temperature in the range of 0° to 70° C. and a supply voltage in the range of 4.75 to 5.25 volts, utilizes a level of greater than 2.4 volts as a logical one and a level of less than 0.4 volts as a logical zero. Register stage 42 may now be forced to contain, at Time 1, the value needed to effect the aforementioned path sensitization by register 34 at Time 2. Since register stage 42 is not connected to logic circuit 36, its contents at Time 1 or at Time 2 are not directly input to the circuit. These interlaced register stages 42 thus allow for path sensitization of all paths. As earlier stated, by sensitizing substantially all of the paths of the logic circuit under test 36, one may detect substantially all of the propagation delay faults associated with logic circuit 36. Furthermore, since serial shift data type registers are used by this invention, one may detect these propagation delay errors at the approximate operating speed of the logic circuit 36 under test.

Figure 3:
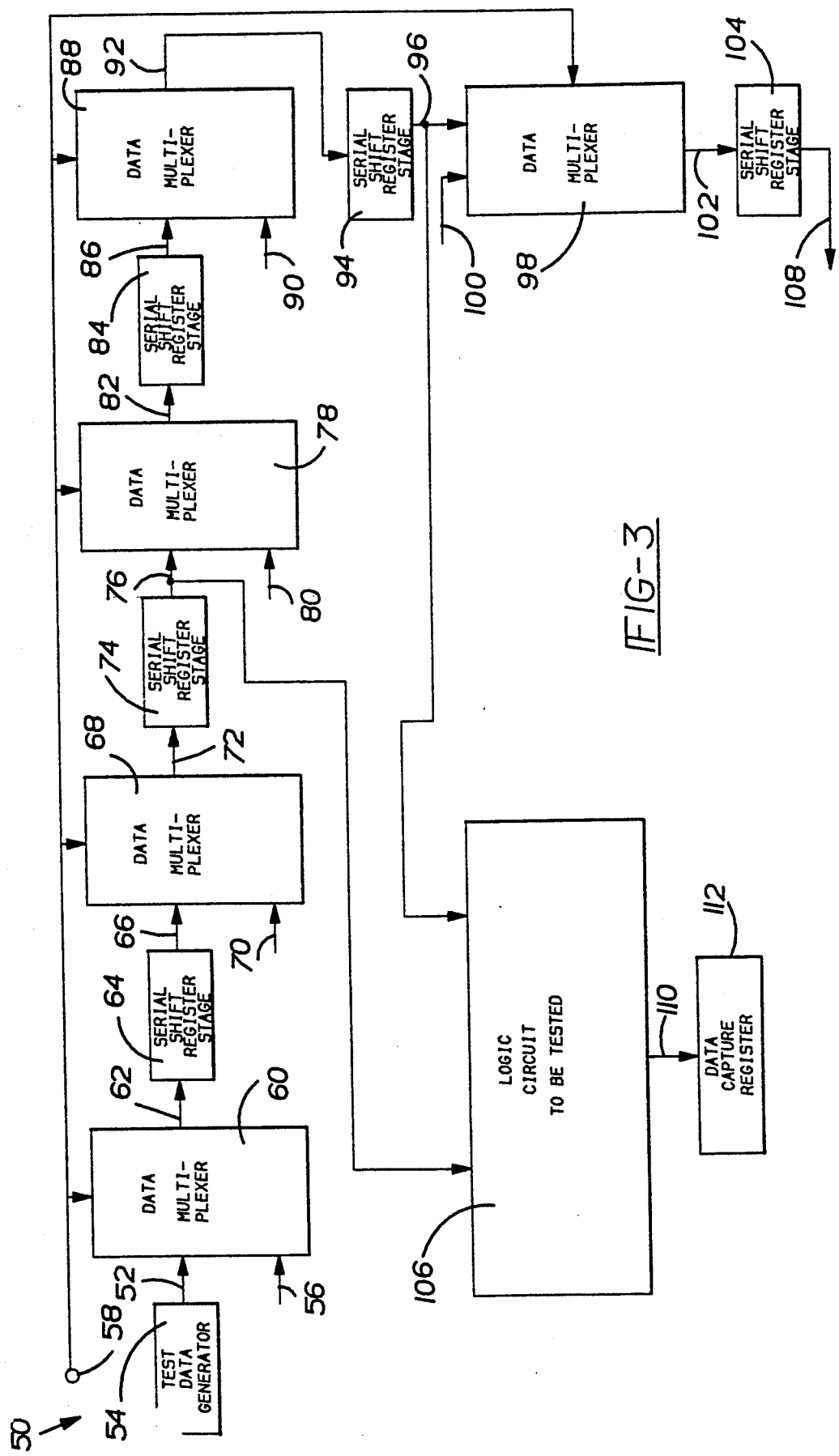
FIG. 3 is a fault detection system made in accordance with the teachings of this invention.

A fault detection apparatus 50 which embodies the principles of this invention is exemplified in FIG. 3. Test data signal on line 52 is generated by data generator 54. Generator 54 is a well known sequence type data generator. Test data signal on line 52, operational data signal on line 56, and mode select signal on line 58 are input to "two to one" multiplexer 60. Alternatively, test data signal on line 52 may be applied to a serial input of a data shift register (not shown). The output of this serial input data shift register could be coupled to the input of multiplexer 60. Signal on line 62 is output from multiplexer 60 and is substantially similar to either operational data signal on line 56 or test data signal on line 52, wherein this determination is made by the mode select signal on line 58. Output signal on line 62 is input to serial data shift register stage on line 64 which produces output signal on line 66 which is substantially similar to input signal on line 62. Output signal on line 66 is input to multiplexer 68 along with operational data signal on line 70 and mode select signal on line 58. Multiplexer 68 produces output signal on line 72 which is substantially similar to either operational data signal on line 70 or to signal on line 66, wherein this determination is made by the mode select signal on line 58. Output signal on line 72 is input to serial data shift register stage 74 which produces output signal on line 76. Serial data shift register stage 74 is also coupled to the logic circuit to be tested 106 by output signal on line 76. Signal on line 76 is substantially similar to signal on line 72. Output signal on line 76 is also input to multiplexer 78 along with operational data signal on line 80 and mode select signal on line 58. Multiplexer 78 produces output signal on line 82 which is substantially similar to either operational data signal on line 80 or to signal on line 76 wherein this determination is made by the mode select signal on line 58. Signal on line 82 is input to serial data shift register stage 84 which produces an output signal on line 86 which is substantially similar to signal on line 82. Signal on line 86 is input to multiplexer 88 along with operational data signal on line 90 and mode select signal on line 58. Multiplexer 88 produces output signal on line 92 which is substantially similar to either signal on line 86 or operational data signal on line 90, wherein this determination is made by the mode select signal on line 58. Signal on line 92 is input to serial data shift register stage 94 which produces output signal on line 96. Serial data shift register stage 94 is also coupled to the logic circuit to be tested 106 by output signal on line 96. Output signal on line 96 is substantially similar to signal on line 92. Signal on line 96 is also input to multiplexer 98 along with operational data signal on line 100 and mode select signal on line 58. Multiplexer 98 produces output signal on line 102 which is substantially similar to either signal on line 96 or operational data signal on line 100, wherein this determination is made by mode select signal on line 58. Signal on line 102 is input to output serial data shift register stage 104 which produces output signal on line 108 which is substantially similar to signal on line 102. Signal on line 110 represents the output of the logic circuit 106 resulting from signals on lines 76 and 96. Signal on line 110 is connected to data capture register 112 so that the output of logic circuit 106 may be analyzed. It should be realized that all of the aforementioned serial data shift register stages (64, 74, 84, 94, and 104) are of the single bit type.

During testing operation, mode select signal on line 58 is chosen so that multiplexers 60, 68, 78, 88 and 98 will ignore their associated operational data signals on lines 56, 70, 80, 90, and 100. These signals are used by logic circuit 106 during its normal operation. Test data is provided by generator 54 to multiplexer 60 through signal line 52. The test data is then shifted, one bit at a time, through multiplexers 60, 68, 78, 88, and 98 and single bit serial data shift register stages 64, 74, 84, 94, and 104 until the initial test data bit is output from the fault detection system 50 on signal line 108. As the test data traverses the fault detection system 50, it is applied to logic circuit 106 by signals on lines 76 and 96. Signals on lines 76 and 96 substantially represent the contents of single bit serial data shift register stages 74 and 94 at a given time. It should be realized that the test data is continually traversing the aforementioned multiplexers and registers of fault detection system 50 thereby dynamically changing the contents of single bit serial data shift registers 64, 74, 84, 94, and 104.

The placement of single bit serial data shift register stage 84 logically between single bit serial data shift registers 74 and 94 allows for sensitization of substantially all the paths associated with logic circuit 106. Also, as stated earlier, this substantially complete path sensitization provides for the detection of approximately all of the propagation delay faults associated with logic circuit 106. The use of these single bit serial data shift register stages also allows for the detection of the aforementioned propagation delay faults at the approximate operational speed of the logic circuit 106.

Various modifications and alterations will be readily suggested to persons skilled in the art. It is intended therefore, that the foregoing be considered as exemplary only, and the scope of the invention be ascertained solely from the following claims.

What is claimed is:

1. A circuit for facilitating fault detection in testing a logic circuit, comprising:
    (a) first serial data shift register means for storing and transferring test data, said first serial data shift register means having an input and an output;
    (b) first means for transferring said tests data from said first serial data shift register means to said logic circuit;
    (c) second serial data shift register means for storing and transferring said test data, said second serial data shift register means having an input and an output;
    (d) second means for transferring said test data from said second serial data shift register means to said logic circuit; and
    (e) third serial data shift register means for storing and transferring said test data, having an input and an output wherein said input is coupled to said output of said first serial data shift register means and said output is coupled to the input of said second serial data shift register means, whereby said logic circuit is enabled to be tested at its normal operating speed such that substantially all of the propagation defaults associated with said logic may be detected.

2. The circuit of claim 1 which further comprises data multiplexing means for selecting data, said data multiplexing means having a plurality of inputs, an output and a mode select port; and wherein one of said outputs of said first, second, or third serial data shift register means and said test data are coupled to said input of said data multiplexing means and wherein said output of said data multiplexing means is coupled to one of said inputs of said first, second, and third serial data shift register means.

3. The circuit of claim 2 wherein an input of said data multiplexing means is also coupled to an operational data signal associated with said logic circuit and wherein, said mode select port of said data multiplexing means is coupled to a mode select signal such that said mode select signal forces said output of said data multiplexing means to be substantially similar to either said operation data signal or to said output of said first, second, or third serial data shift register means.

4. The circuit of claim 1, wherein said logic circuit is comprised of a plurality of signal paths and wherein said test data is selected such that any of said signal paths may be path sensitized.

5. In a system for detecting faults associated with a logic circuit, the improvement comprising:
    (a) first serial data shift register means for storing and transferring test data, said first serial data register means having an input and an output;

(b) first means for transferring said tests data from said first serial data shift register means to said logic circuit;
(c) second serial data shift register means for storing and transferring said test data, said second serial data shift register means having an input and an output;
(d) second means for transferring said test data from said second serial data shift register means to said logic circuit;
(e) third serial data shift register means for storing and transferring said test data, having an input and an output wherein said input is coupled to said output of first serial data shift register means and said output is coupled to the input of said second serial data shift register means, whereby said logic circuit is enabled to be tested at its normal operating speed such that substantially all propagation delay faults may be detected.

6. The improvement of claim 5 which further comprises data multiplexing means for selecting data, said data multiplexing means having a plurality of inputs, an output, and a mode select port; and wherein one of said outputs of said first, second, or third serial data shift register means and said test data are coupled to said input of said data multiplexing means and wherein said output of said data multiplexing means is coupled to one of said inputs of said first, second and third serial data shift register means.

7. The improvement of claim 6 wherein said input of said data multiplexing means is also coupled to an operational data signal associated with said logic circuit and wherein, said mode select port is coupled to a mode select signal such that said mode select signal forces said output of said data multiplexing means to be substantially similar to either said operational data signal or to said output of said first, second, or third serial data shift register means.

8. A method for detecting faults associated with a logic circuit, wherein said fault detection may occur at the normal operating speed of said logic circuit such that substantially all of the propagation delay faults of said logic circuit may be detected, wherein said method comprises:
(a) providing a first serial data shift register means for storing and transferring test data to said logic circuit, wherein said first serial data shift register means has an input and output and said logic circuit has an output;
(b) providing a second serial data shift register means for storing and transferring said test data to said logic circuit, wherein said second serial data shift register means has an input and output;
(c) coupling a third serial data shift register means for storing and transferring said test data, having an input and output, to said first and second serial data shift register means such that the output of said third serial data shift register means is coupled to the input of said second serial data shift register means and the input of said third serial data shift register means is coupled to the output of said first serial data shift register means;
(d) inputting said test data to said first serial data shift register means;
(e) shifting said input data, one bit at a time, through said first, second, and third serial data shift register means while transferring the bits in the first and second data shift register means to the logic circuit; and
(f) monitoring said output of said logic circuit to detect said fault.

9. The method of claim 8, wherein said method further comprises connecting a plurality of multiplexers between the first, second and third shift registers; and using the multiplexers to selectively couple test data or operational data to the shift registers.

10. The method of claim 9, wherein said logic circuit includes at least one AND gate having two inputs and wherein the first and second data shift registers provide test signals substantially simultaneously to the AND gate inputs.

* * * * *